United States Patent
Suzuki et al.

(10) Patent No.: US 11,288,423 B2
(45) Date of Patent: Mar. 29, 2022

(54) COMPONENT SHAPE DATA CREATION SYSTEM FOR IMAGE PROCESSING AND COMPONENT SHAPE DATA CREATION METHOD FOR IMAGE PROCESSING

(71) Applicant: FUJI CORPORATION, Chiryu (JP)

(72) Inventors: Mikiya Suzuki, Nishio (JP); Kazuya Kotani, Toyota (JP); Keiichi Ono, Anjo (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/959,344

(22) PCT Filed: Jan. 17, 2018

(86) PCT No.: PCT/JP2018/001129
§ 371 (c)(1),
(2) Date: Jun. 30, 2020

(87) PCT Pub. No.: WO2019/142248
PCT Pub. Date: Jul. 25, 2019

(65) Prior Publication Data
US 2021/0064797 A1 Mar. 4, 2021

(51) Int. Cl.
*G06F 3/04883* (2022.01)
*G06F 30/20* (2020.01)
(Continued)

(52) U.S. Cl.
CPC ............ *G06F 30/20* (2020.01); *G06F 3/0482* (2013.01); *G06F 3/0485* (2013.01);
(Continued)

(58) Field of Classification Search
CPC . G06F 30/20; G06F 3/04845; G06K 9/00201; G06T 17/00; G06T 19/20; G06T 2219/2016
See application file for complete search history.

(56) References Cited

U.S. PATENT DOCUMENTS

| 6,115,042 A | 9/2000 | Li et al. |
| 2006/0109256 A1* | 5/2006 | Grant .................. G06F 3/0485 345/173 |

(Continued)

FOREIGN PATENT DOCUMENTS

| JP | 11-108620 A | 4/1999 |
| JP | 2006-302949 A | 11/2006 |

(Continued)

OTHER PUBLICATIONS

International Search Report dated Mar. 20, 2018 in PCT/JP2018/001129 filed Jan. 17, 2018, 2 pages.

*Primary Examiner* — Andrea C Leggett
(74) *Attorney, Agent, or Firm* — Oblon, McClelland, Maier & Neustadt, L.L.P.

(57) ABSTRACT

A component image obtained by imaging a component for which component shape data for image processing is to be created is acquired and displayed on a screen of a display device, and a model pattern corresponding to a measurement target portion of the component image is displayed on the component image in a superimposed manner. At least one fine adjustment icon of fine adjustment icons for finely adjusting a size and/or position of the model pattern superimposed on the component image on the screen of the display device is displayed on the screen of the display device in a predetermined positional relationship with the model pattern.

11 Claims, 9 Drawing Sheets

(51) Int. Cl.
   *G06F 3/04817*   (2022.01)
   *G06F 3/0482*    (2013.01)
   *G06F 3/04845*   (2022.01)
   *G06F 3/0485*    (2022.01)
   *G06K 9/00*      (2022.01)
   *G06T 17/00*     (2006.01)
   *G06T 19/20*     (2011.01)

(52) U.S. Cl.
   CPC ...... *G06F 3/04817* (2013.01); *G06F 3/04845* (2013.01); *G06K 9/00201* (2013.01); *G06T 17/00* (2013.01); *G06T 19/20* (2013.01); *G06T 2219/2016* (2013.01)

(56) References Cited

U.S. PATENT DOCUMENTS

2011/0243456 A1   10/2011   Kawai et al.
2014/0314302 A1   10/2014   Minato et al.

FOREIGN PATENT DOCUMENTS

JP   2011-211088 A   10/2011
JP   2013-140090     7/2013

* cited by examiner

COMPONENT SHAPE DATA CREATION SYSTEM FOR IMAGE PROCESSING AND COMPONENT SHAPE DATA CREATION METHOD FOR IMAGE PROCESSING

TECHNICAL FIELD

The present specification discloses a technique related to a component shape data creation system for image processing and a component shape data creation method for image processing for creating component shape data for image processing which is used for performing image recognition of a component to be mounted using a component mounting machine.

BACKGROUND ART

In general, in the component mounting machine, when performing image recognition of a component by using a camera to image the component picked up by a suction nozzle, the image recognition of the component is performed by using the component shape data for image processing (data representing appearance features such as the size of the body portion of the component, and the positions, size, pitch, and number of bumps and leads) created in advance, and a determination is made about the deviation amount of the suction position and the good or bad of the suction orientation of the component. In the conventional art, when a user of a component mounting machine creates component shape data for image processing, in addition to a method using CAD data of the component, there is a method of using a camera to image a component for which component shape data for image processing is to be created and using the captured image to create the component shape data for image processing (Patent Literature 1).

With this type of component shape data creation system for image processing, it is necessary for an operator to designate which portions of the component image captured by the camera is to be measured, and for this reason, there is a system in which a model pattern corresponding to a measurement target portion (component body, bump, lead, or the like) of a component image displayed on a screen of a display device is displayed on the component image in a superimposed manner, and after the operator performs an adjustment operation of aligning the size and the position of the model pattern with the measurement target portion of the component image on the screen of the display device, a computer of the system acquires information on the size and the position of the model pattern to create component shape data for image processing. In this case, rough adjustment of the size and the position of the model pattern on the screen of the display device is performed by dragging a mouse, and then fine adjustment is performed by inputting numerical values from a keyboard.

PATENT LITERATURE

Patent Literature 1: JP-A-2011-211088

BRIEF SUMMARY

Technical Problem

When the operator performs fine adjustment of the model pattern by inputting numerical values from the keyboard, the operator visually measures the amount of deviation between the model pattern displayed on the screen of the display device and the measurement target portion of the component image to estimate the numerical value of the fine adjustment, and inputs the numerical value from the keyboard.

However, when the operator changes the numerical value input from the keyboard, it is difficult to understand how much the size and the position of the model pattern change on the screen of the display device, and therefore, when the model pattern is aligned with the measurement target portion of the component image on the screen of the display device, it is difficult to align the model pattern by one numerical input, and the numerical input is repeated several times to align the model pattern, resulting in a disadvantage that the fine adjustment operation of the model pattern takes effort and time.

Solution to Problem

In order to solve the above-mentioned problem, there is provided a component shape data creation system for image processing for creating component shape data for image processing used when performing image recognition of a component to be mounted using a component mounting machine, the system including: a display device configured to display a component image obtained by imaging a component for which the component shape data for image processing is to be created; a model pattern display section configured to display, on the component image, a model pattern corresponding to a measurement target portion of the component image displayed on a screen of the display device, in a superimposed manner; an icon display section configured to display, on the screen of the display device, at least one fine adjustment icon for finely adjusting a size and/or position of the model pattern superimposed on the component image on the screen of the display device in a predetermined positional relationship with the model pattern; a model pattern fine adjustment section configured to, when an operator performs a fine adjustment operation of aligning the model pattern with the measurement target portion of the component image on the screen of the display device, finely adjust the size and/or position of the model pattern by a predetermined amount each time the operator places a pointer of a mouse on the fine adjustment icon and clicks the fine adjustment icon once; and a component shape data creation section configured to acquire information on the size and/or position of the model pattern finely adjusted by the model pattern fine adjustment section according to the number of clicks until the fine adjustment operation is completed and create the component shape data for image processing.

With this configuration, when the operator performs the fine adjustment operation of aligning the model pattern with the measurement target portion of the component image on the screen of the display device, the size and/or position of the model pattern is finely adjusted by a predetermined amount each time the operator places the pointer of the mouse on the fine adjustment icon and clicks the fine adjustment icon once, and therefore, the operator may just repeat the clicking while looking at the screen of the display device until the deviation between the model pattern and the measurement target portion of the component image is eliminated. Thus, the fine adjustment operation of the model pattern is simplified, and it is possible to efficiently create the component shape data for image processing using the component image.

DESCRIPTION OF EMBODIMENTS

Hereinafter, three embodiments, first to third embodiments will be described.

First Embodiment

A first embodiment be described with reference to FIGS. 1 to 6.

Figure 1:
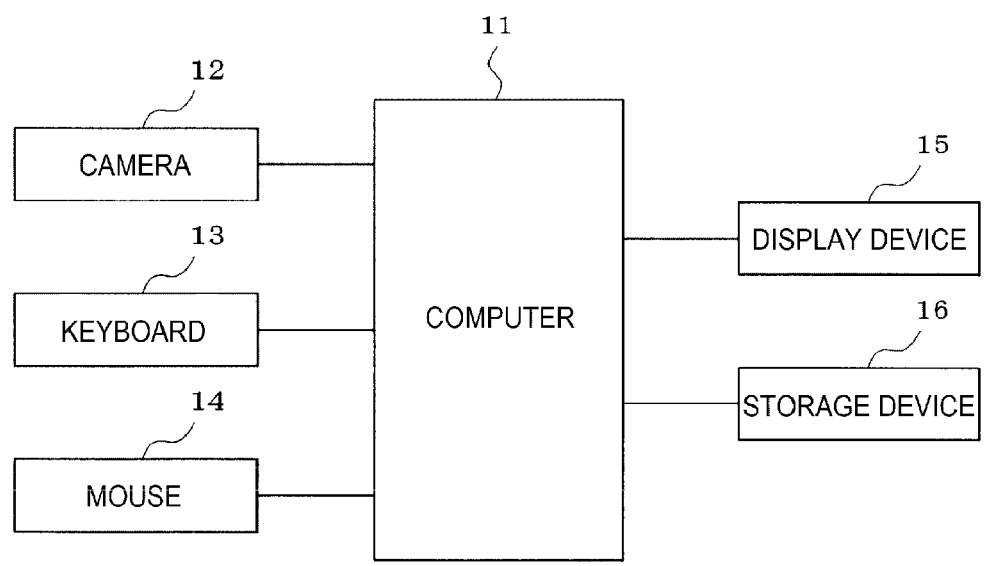
FIG. 1 is a block diagram showing a configuration of a component shape data creation system for image processing according to a first embodiment.
Figure 6:
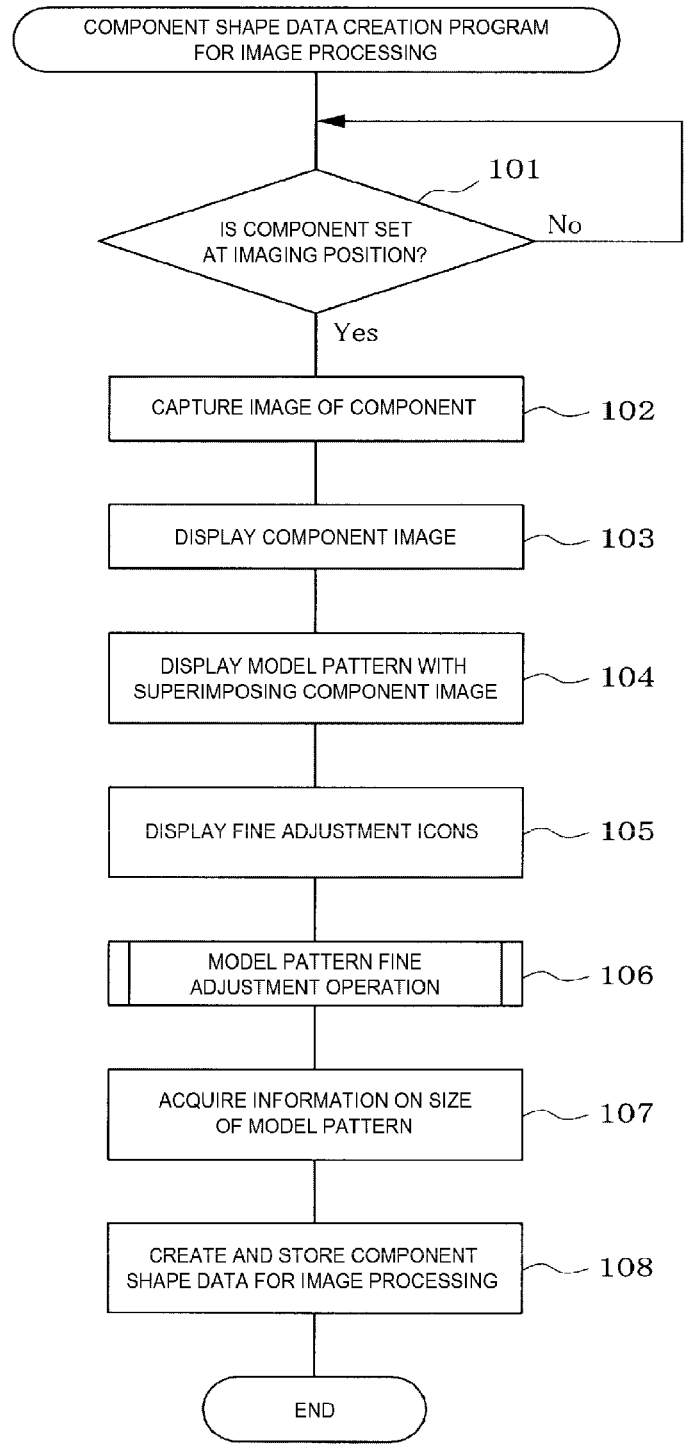
FIG. 6 is a flowchart showing a flow of processing of an component shape data for image processing creation program according to the first embodiment.

As shown in FIG. 1, a component shape data creation system for image processing is configured to include computer 11 such as a personal computer, camera 12 that images a measurement target portion of a component for which component shape data for image processing is to be created, keyboard 13, mouse 14, display device 15 such as a liquid crystal display, or a CRT, and storage device 16 that stores various data such as an component shape data for image processing creation program of FIG. 6 to be executed when creating component shape data for image processing, which will be described later, and data of model pattern 31. Storage device 16 is configured using a rewritable non-volatile storage medium (for example, a hard disk device or the like) that holds storage data even when the power supply to the device is turned off.

Computer 11 of the component shape data creation system for image processing according to the first embodiment, although not shown, is provided outside the component mounting machine (outside the component mounting line), and is connected to a production management computer of the component mounting line or each component mounting machine via a network so as to be able to communicate with each other. The component shape data for image processing created by computer 11 is transferred to the production management computer and/or each component mounting machine. In the first embodiment, the component for which the component shape data for image processing is to be created is a BGA component in which multiple bumps 22 (see FIG. 2) are formed on a lower surface of the component in a grid-shaped arrangement pattern, and a case will be described in which component shape data for image processing including data of the size (diameter dimension) of bumps 22 and the bump pitch, which is the measurement target portion of the component, is created.

Figure 3:
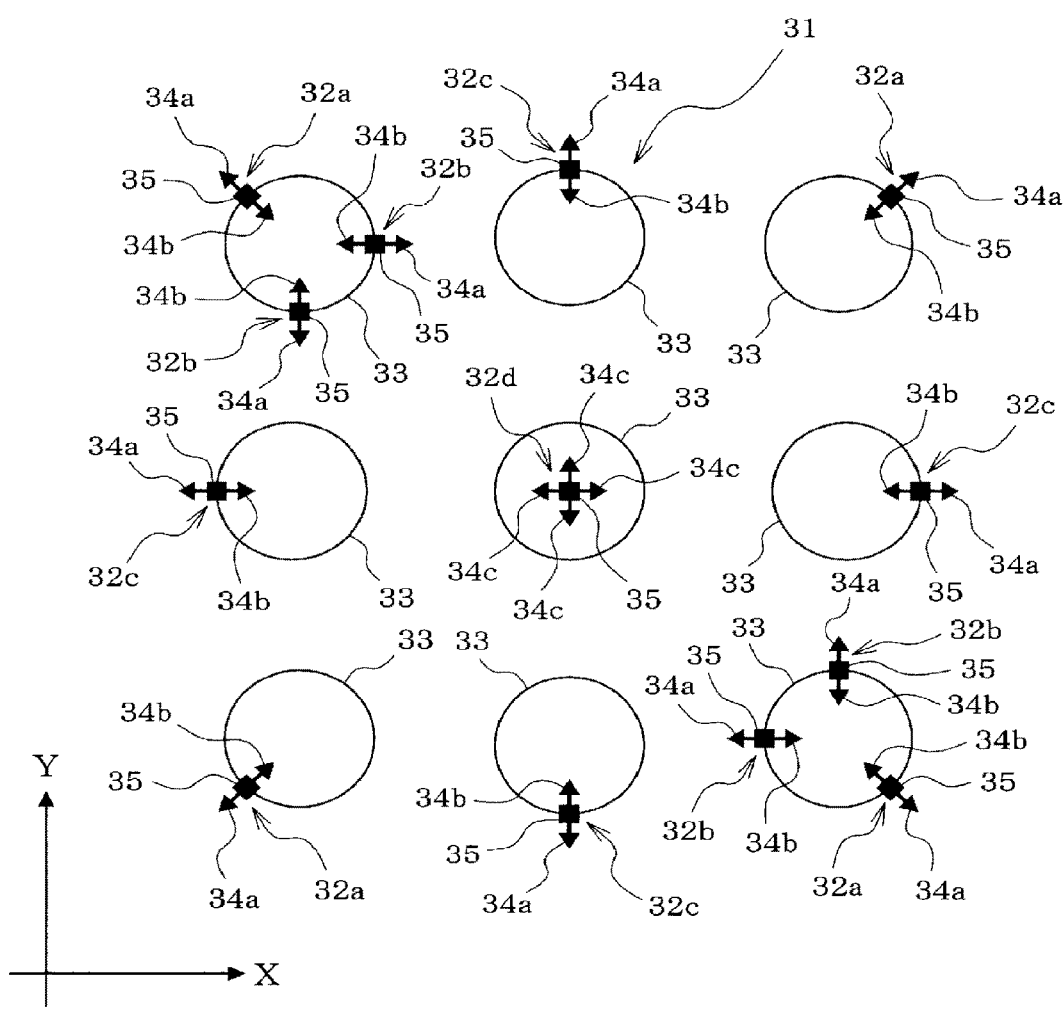
FIG. 3 is a diagram showing an example of a model pattern according to the first embodiment.
Figure 4:
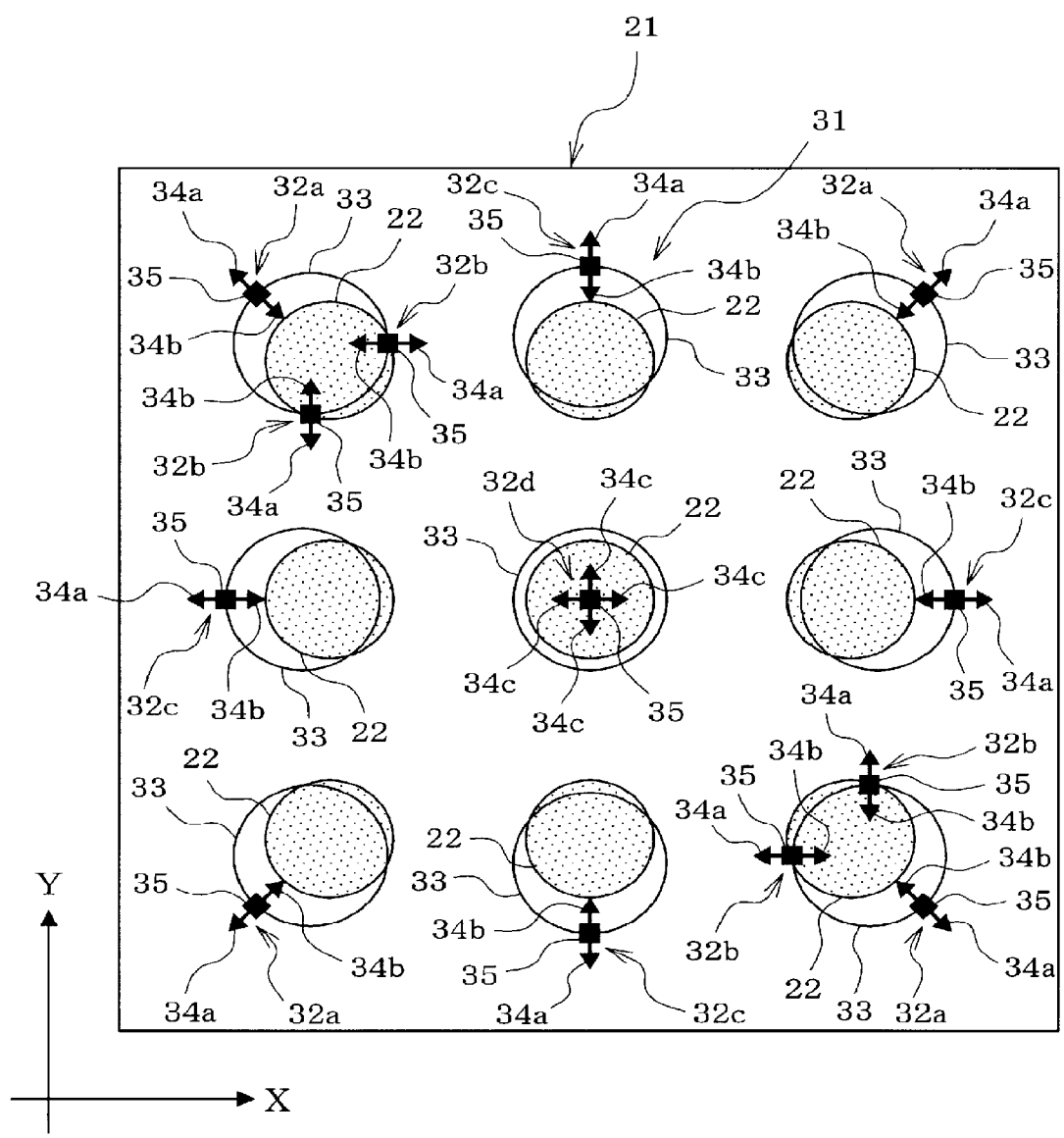
FIG. 4 is a diagram showing an example in which the model pattern according to the first embodiment is displayed on the component image in a superimposed manner.
Figure 5A:
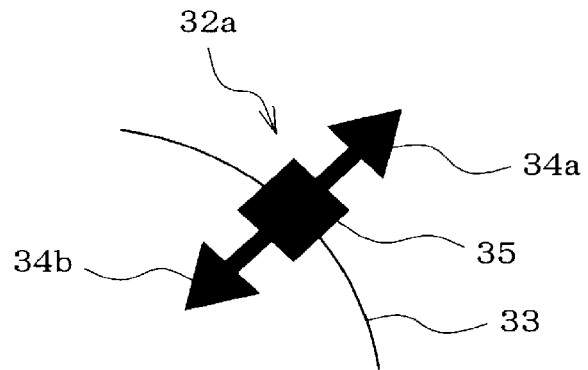
FIG. 5A is an enlarged view showing an example of a first icon according to the first embodiment.
Figure 5B:
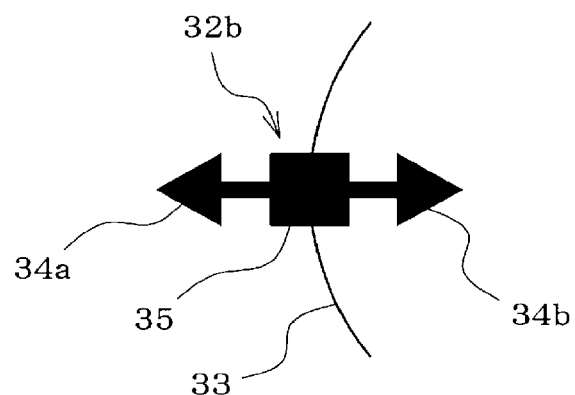
FIG. 5B is an enlarged view showing an example of a second icon according to the first embodiment.
Figure 5C:
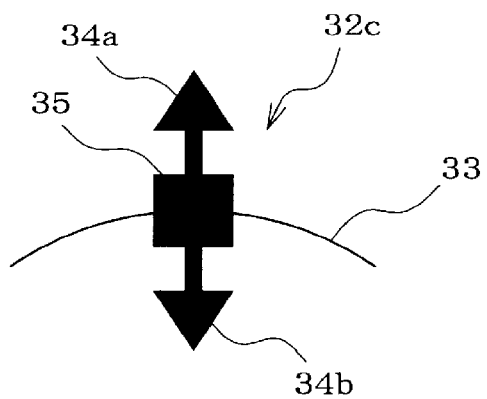
FIG. 5C is an enlarged view showing an example of a third icon according to the first embodiment.
Figure 5D:
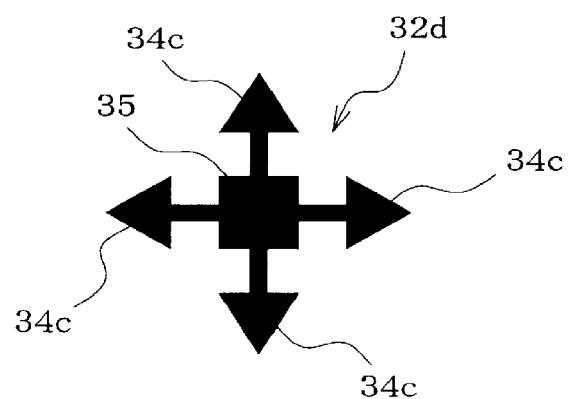
FIG. 5D is an enlarged view showing an example of a fourth icon according to the first embodiment.

By executing the component shape data for image processing creation program of FIG. 6 to be described later, computer 11 functions as a "model pattern display section" that displays, on component image 21, model pattern 31 (see FIG. 3) corresponding to an arrangement pattern of bumps 22, which is a measurement target portion of component image 21 (see FIG. 2) displayed on the screen of display device 15, in a superimposed manner as shown in FIG. 4, and also functions as an "icon display section" that displays, on the screen of display device 15, at least one fine adjustment icon of fine adjustment icons 32a to 32d for finely adjusting the size and/or position of model pattern 31 superimposed on component image 21 on the screen of display device 15 in a predetermined positional relationship with model pattern 31. In the first embodiment, since the arrangement pattern of bumps 22 of component image 21 is set as the measurement target portion, adjusting the size of model pattern 31 means adjusting both the size (diameter dimension) of bumps 33 and the bump pitch of model pattern 31 at the same time.

Further, when the operator performs a fine adjustment operation of aligning bump 33 of model pattern 31 with bump 22 of component image 21 on the screen of display device 15, computer 11 functions as a "model pattern fine adjustment section" that finely adjusts the size and/or position of model pattern 31 by a predetermined amount each time the operator places the pointer of mouse 14 on each of fine adjustment icons 32a to 32d and clicks the fine adjustment icon once, and also functions as a "component shape data creation section" that acquires information on the size and/or position of model pattern 31 finely adjusted according to the number of clicks until the fine adjustment operation is completed and creates component shape data for image processing.

Here, component image 21 displayed on the screen of display device 15 is an image obtained by imaging the arrangement pattern of bumps 22, which is the measurement target portion of the BGA component for which the component shape data for image processing is to be created. In the first embodiment, component image 21 is captured by camera 12 of the component shape data creation system for image processing, but a component image captured by an external camera, such as a component imaging camera of the component mounting machine, may be acquired.

Model pattern 31 is created in advance by using CAD data, specification data, and the like of the arrangement pattern of bumps 22 of the BGA component for which the component shape data for image processing is to be created, and is stored in storage device 16. Model pattern 31 may be created by computer 11 of the component shape data creation system for image processing, or may be created by an external system and acquired.

Figure 2:
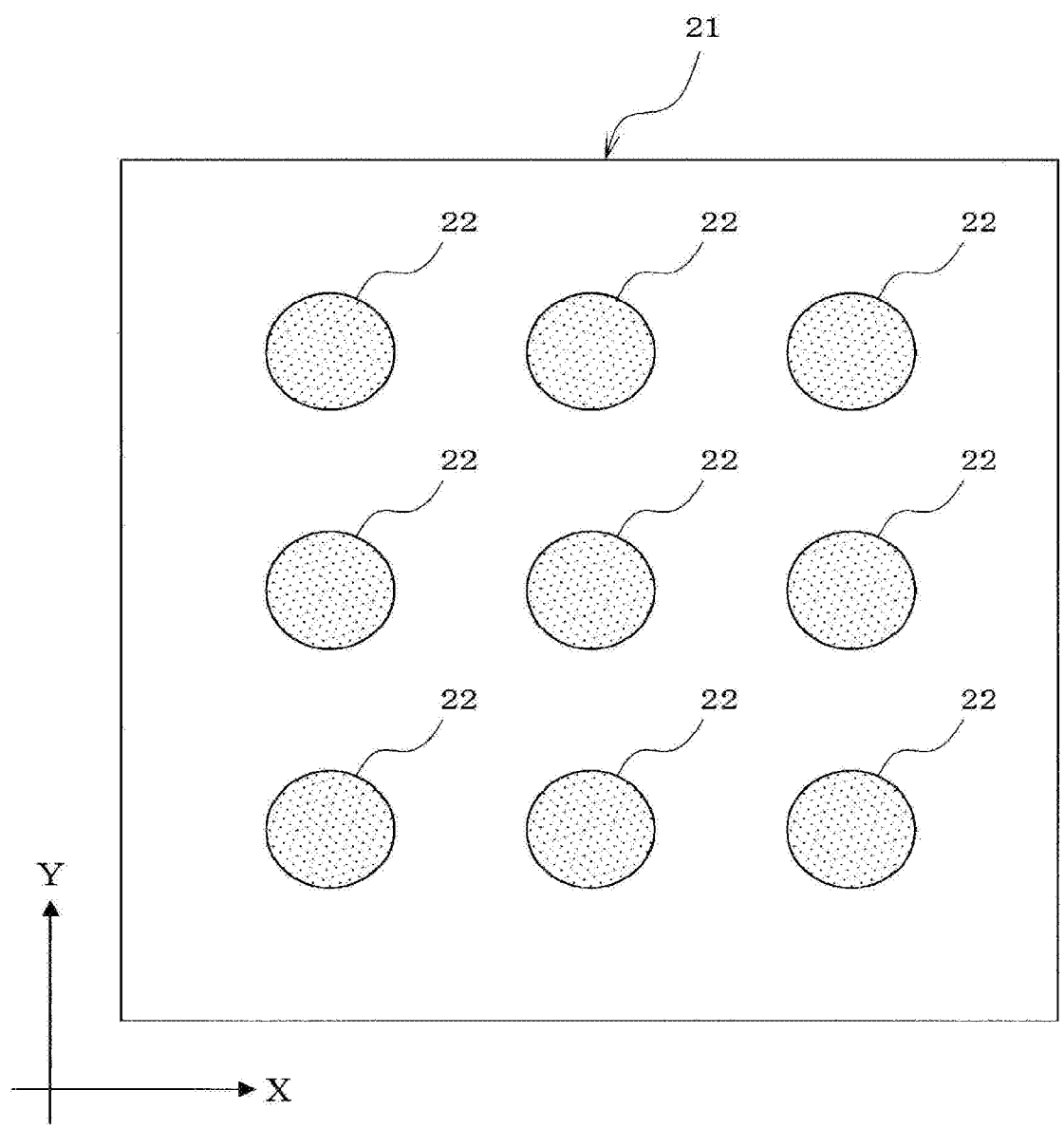
FIG. 2 is a diagram showing an example of a component image according to the first embodiment.

In the examples of FIGS. 2 to 4, the number of bumps 22 of component image 21 and the number of bumps 33 of model pattern 31 are nine, respectively, but it is needless to say that the number may be greater or less. Fine adjustment icons 32a to 32d displayed on the screen of display device 15 in a predetermined positional relationship with model pattern 31 each have a shape in which two or four arrow buttons 34a to 34c indicating the fine adjustment direction (two or four directions) of the size or the position of model pattern 31 and one drag button 35 for dragging are combined. The shape of arrow buttons 34a to 34c may be any shape as long as the direction to be finely adjusted can be known. The shape of drag button 35 is not limited to a square as long as it can be distinguished from arrow buttons 34a to 34c, and may be any shape such as a circular.

In the first embodiment, as shown in FIGS. 3, 4, and 5A to 5D, there are four types of fine adjustment icons 32a to 32d, and first icon 32a for collectively scaling up or down both the size of each bump 33 and the bump pitch of model pattern 31, second icon 32b for collectively scaling up or down only the size of each bump 33 of model pattern 31, third icon 32c for collectively scaling up or down only the bump pitch of model pattern 31, and fourth icon 32d for moving the position of model pattern 31 are displayed on the screen of display device 15 in a predetermined positional relationship with model pattern 31.

Specifically, as shown in FIGS. 3 and 4, first icons 32a (see FIG. 5A) for collectively scaling up or down both the size of each bump 33 and the bump pitch of model pattern 31 are disposed on four bumps 33 located at the four corners of model pattern 31, respectively. Each of first icons 32a includes two arrow buttons 34a and 34b facing outside and inside in the diagonal direction of model pattern 31, and drag button 35 located at the center of two arrow buttons 34a and 34b.

Each time the operator places the pointer of mouse 14 on arrow button 34a facing outside in the diagonal direction of model pattern 31 out of two arrow buttons 34a and 34b of first icon 32a and clicks the arrow button once, both the size of each bump 33 and the bump pitch of model pattern 31 are collectively scaled up by a predetermined amount, and each time the operator places the pointer of mouse 14 on arrow button 34b facing inside in the diagonal direction of model pattern 31, which is the opposite direction, and clicks the arrow button once, both the size of each bump 33 and the bump pitch of model pattern 31 are collectively scaled down by a predetermined amount. Regarding the scaling-up/scaling-down of the size of model pattern 31, the size of model pattern 31 may be scaled up/down by fixing the corner of model pattern 31 on the side opposite to the clicking side, or the size of model pattern 31 may be scaled up/down by fixing the center of model pattern 31.

When the operator places the pointer of mouse 14 on drag button 35 of first icon 32a and performs dragging outwardly in the diagonal direction of model pattern 31, both the size of each bump 33 and the bump pitch of model pattern 31 are collectively scaled up according to the operation amount of the dragging, and when the operator performs dragging inwardly in the diagonal direction of model pattern 31, which is the opposite direction, both the size of each bump 33 and the bump pitch of model pattern 31 are collectively scaled down according to the operation amount of the dragging.

As shown in FIGS. 3 and 4, for example, two second icons 32b (see FIG. 5B) for collectively scaling up or down only the size of each bump 33 of model pattern 31 are disposed on, for example, two bumps 33 out of four bumps 33 located at the four corners of model pattern 31, respectively. Each of second icons 32b includes two arrow buttons 34a and 34b facing outside and inside in the lateral direction (X-direction) or the longitudinal direction (Y-direction) of bump 33, and drag button 35 located at the center of two arrow buttons 34a and 34b. In the example of FIGS. 3 and 4, four second icons 32b are disposed, but the number of second icons 32b may be three or less or five or more. In the first embodiment, since the shape of bump 33 is circular, even if the number of second icons 32b is only one, only the size of each bump 33 of model pattern 31 can be collectively scaled up or down. When the shape of bump 33 is square, by disposing second icons 32b one by one on two adjacent sides of the square bump 33, the lateral dimension and the longitudinal dimension of each bump 33 of model pattern 31 can be separately scaled up or down.

Each time the operator places the pointer of mouse 14 on arrow button 34a facing the outside of bump 33 out of two arrow buttons 34a and 34b of second icon 32b and clicks the arrow button once, only the size of each bump 33 of model pattern 31 is collectively scaled up by a predetermined amount, and each time the operator places the pointer of mouse 14 on arrow button 34b facing the inside of bump 33, which is the opposite direction, and clicks the arrow button once, only the size of each bump 33 of model pattern 31 is collectively scaled down by a predetermined amount.

When the operator places the pointer of mouse 14 on drag button 35 of second icon 32b and performs dragging toward the outside of bump 33, only the size of each bump 33 of model pattern 31 is collectively scaled up according to the operation amount of the dragging, and when the operator performs dragging toward the inside of bump 33, which is the opposite direction, only the size of each bump 33 of model pattern 31 is collectively scaled down according to the operation amount of the dragging.

As shown in FIGS. 3 and 4, four third icons 32c (see FIG. 5C) for collectively scaling up or down only the bump pitch of model pattern 31 in the lateral direction or the longitudinal direction are disposed on four bumps 33 located at the center of the four sides of model pattern 31, respectively. Each of third icons 32c includes two arrow buttons 34a and 34b facing outside and inside in the lateral direction or the longitudinal direction of model pattern 31, and drag button 35 that is located at the center of two arrow buttons 34a and 34b.

Each time the operator places the pointer of mouse 14 on arrow button 34a facing outside in the lateral direction or the longitudinal direction of model pattern 31 out of two arrow buttons 34a and 34b of third icon 32c and clicks the arrow button once, only the bump pitch in the lateral direction or the longitudinal direction of model pattern 31 is collectively scaled up by a predetermined amount, and each time the operator places the pointer of mouse 14 on arrow button 34b facing inside in the lateral direction or the longitudinal direction of model pattern 31, which is the opposite direction, and clicks the arrow button once, only the bump pitch in the lateral direction or the longitudinal direction of model pattern 31 is collectively scaled down by a predetermined amount. Regarding the scaling-up/scaling-down of the bump pitch of model pattern 31, the bump pitch of model pattern 31 may be scaled up/down by fixing the side portion of model pattern 31 on the side opposite to the clicking side, or the bump pitch of model pattern 31 may be scaled up/down by fixing the center of model pattern 31.

When the operator places the pointer of mouse 14 on drag button 35 of third icon 32c and performs dragging outwardly in the lateral direction or the longitudinal direction of model pattern 31, only the bump pitch in the lateral direction or the longitudinal direction of model pattern 31 is collectively scaled up according to the operation amount of the dragging, and when the operator performs dragging inwardly in the lateral direction or the longitudinal direction of model pattern 31, which is the opposite direction, only the bump pitch in the lateral direction or the longitudinal direction of model pattern 31 is collectively scaled down according to the operation amount of the dragging.

As shown in FIGS. 3 and 4, fourth icon 32d (see the FIG. 5D) for moving the position of model pattern 31 is disposed at the center of model pattern 31. Fourth icon 32d includes four arrow buttons 34c facing both sides in the lateral direction and both sides in the longitudinal direction, and drag button 35 that is located at the center of four arrow buttons 34c.

Each time the operator places the pointer of mouse 14 on any of four arrow buttons 34c of fourth icon 32d and clicks the arrow button once, the position of model pattern 31 is moved by a predetermined amount in the arrow direction of arrow button 34c. When the operator places the pointer of mouse 14 on drag button 35 of fourth icon 32d and performs dragging, the position of model pattern 31 is moved by the dragging amount in the direction of the dragging.

In the first embodiment, the operator is able to change the amount of fine adjustment of first to fourth icons 32a to 32d per clicking by operating keyboard 13.

In addition to first to fourth icons 32a to 32d described above, an icon for finely adjusting the inclination angle of model pattern 31 in accordance with the inclination of component image 21 may be added.

When the operator performs a fine adjustment operation of clicking or dragging first to fourth icons 32a to 32d described above with mouse 14 to align bumps 33 of model pattern 31 with bumps 22 of component image 21 on the screen of display device 15, computer 11 acquires information on the size of each of bumps 33 and the bump pitch of model pattern 31 that are finely adjusted according to the number of clicks until the fine adjustment operation is completed in accordance with the component shape data for image processing creation program of FIG. 6, and creates component shape data for image processing.

Hereinafter, the processing content of the component shape data for image processing creation program of FIG. 6 executed by computer 11 will be described. When the program is started, first, in step 101, the system waits until the component for which the component shape data for image processing is to be created is set at the imaging position within the visual field range of camera 12. Thereafter, at the time when the component is set at the imaging position, the processing proceeds to step 102, camera 12 images the arrangement pattern of bumps 22, which is the measurement target portion of the component, and in the next step 103, component image 21 is displayed on the screen of display device 15.

Thereafter, the processing proceeds to step 104, model pattern 31 (see FIG. 3) corresponding to the arrangement pattern of bumps 22 of component image 21 displayed on the screen of display device 15 is displayed on component image 21 in a superimposed manner. The processing of step 104 serves as a "model pattern display section".

Then, in the next step 105, first to fourth icons 32a to 32d, which are fine adjustment icons, are displayed on the screen of display device 15 in a predetermined positional relationship with model pattern 31. The processing of step 105 serves as an "icon display section."

Thereafter, the processing proceeds to step 106, when the operator performs the fine adjustment operation of clicking or dragging first to fourth icons 32a to 32d described above with mouse 14 to align bumps 33 of model pattern 31 with bumps 22 of component image 21 on the screen of display device 15, computer 11 finely adjusts the size of each of bumps 33 and the bump pitch of model pattern 31 and the position of model pattern 31 according to the number of clicks and the dragging until the fine adjustment operation is completed, and aligns bumps 33 of model pattern 31 with bumps 22 of component image 21 on the screen of display device 15. The processing of step 106 serves as a "model pattern fine adjustment section".

After the fine adjustment operation is completed, the processing proceeds to step 107, the size of each of bumps 33 and bump pitch of model pattern 31 finely adjusted according to the number of clicking operations and the dragging until the fine adjustment operation is completed are measured, and in the next step 108, the component shape data for image processing is created based on the measured value and stored in storage device 16, and the program ends. The processing of steps 107 and 108 serves as a "component shape data creation section".

In the first embodiment described above, when the operator performs the fine adjustment operation of aligning bump 33 of model pattern 31 with bump 22 of component image 21 on the screen of display device 15, any of the size of each of bumps 33 and the bump pitch of model pattern 31 and the position of model pattern 31 is finely adjusted by a predetermined amount each time operator places the pointer of mouse 14 on any of arrow buttons 34a to 34c of first to fourth icons 32a to 32d, which are fine adjustment icons, and clicks the arrow button once, so that the operator may just repeat the clicking while looking at the screen of display device 15 until the deviation between bumps 33 of model pattern 31 and bumps 22 of component image 21 is eliminated. Thus, even when the component shape data for image processing of the BGA component is created, the fine adjustment operation of model pattern 31 is simplified, and it is possible to efficiently create the component shape data for image processing of the BGA component using component image 21.

Second Embodiment

Next, a second embodiment will be described with reference to FIG. 7. Here, descriptions of substantially the same parts as those of the above first embodiment are omitted or simplified, and different portions are mainly described.

Figure 7:
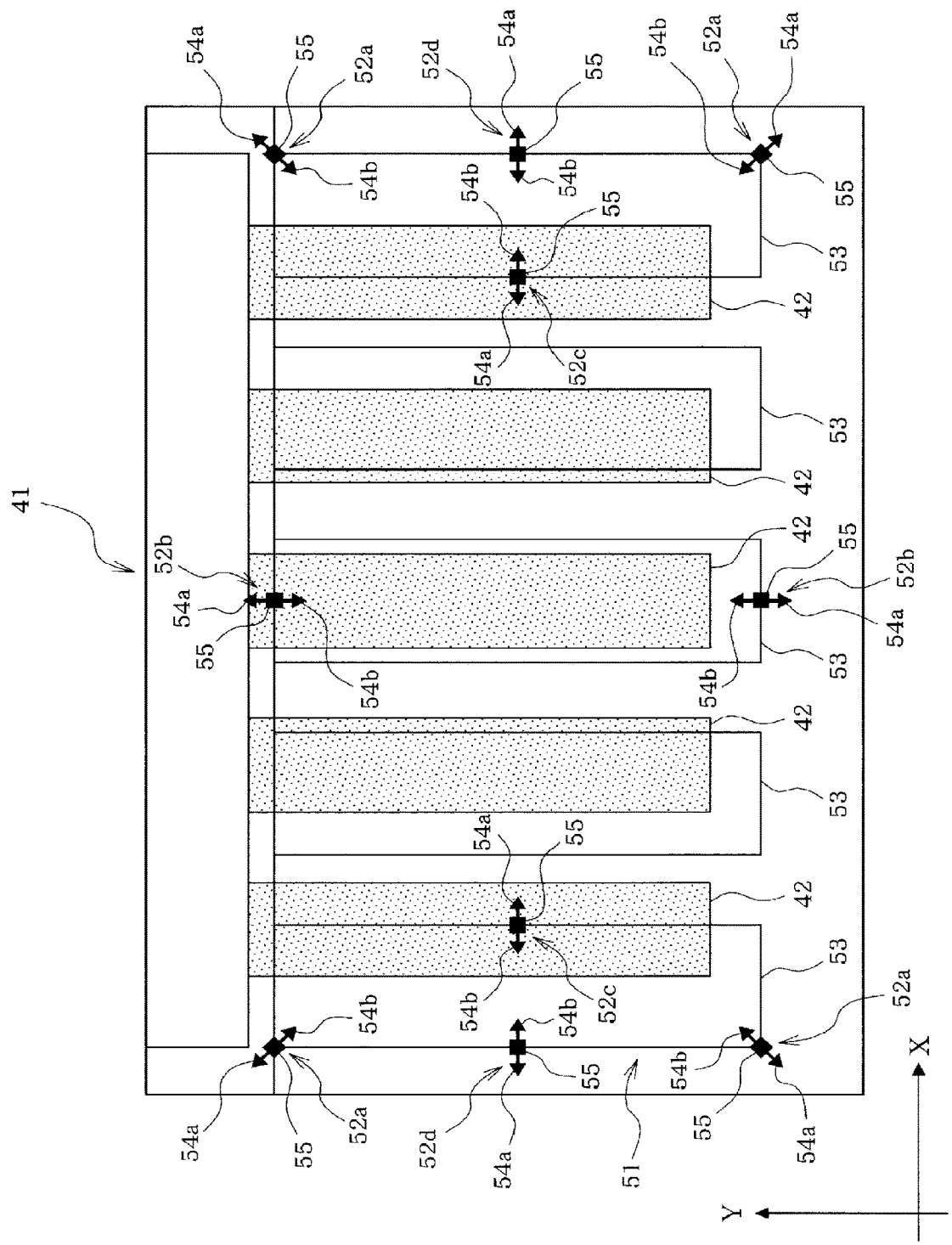
FIG. 7 is a diagram showing an example in which a model pattern according to a second embodiment is displayed on a component image in a superimposed manner.

In the above first embodiment, the component for which the component shape data for image processing is to be created is a BGA component in which multiple bumps 22 are formed on the lower surface of the component in a grid-shaped arrangement pattern; however, in the second embodiment shown in FIG. 7, the component for which the component shape data for image processing is to be created is a lead-attached component in which multiple leads 42 protrude from the side surface of the component, and the measurement target portion thereof is an arrangement pattern of lead 42.

Component image 41 displayed on the screen of display device 15 is an image obtained by imaging the arrangement pattern of leads 42, which is the measurement target portion of the lead-attached component for which the component shape data for image processing is to be created. Component image 41 is captured by camera 12 of the component shape data creation system for image processing, but a component image captured by an external camera, such as a component imaging camera of the component mounting machine, may be acquired.

Model pattern 51 is created in advance by using CAD data, specification data, and the like of the arrangement pattern of leads 42 of the lead-attached component for which the component shape data for image processing is to be created, and stored in storage device 16. Model pattern 51 may be created by computer 11 of the component shape data creation system for image processing, or may be created by an external system and acquired.

In the example of FIG. 7, the number of leads 42 of component image 41 and the number of leads 53 of model pattern 51 are five, respectively, but it is needless to say that the number may be greater or less. Fine adjustment icons 52a to 52d displayed on the screen of display device 15 in a predetermined positional relationship with model pattern 51 each have a shape in which two arrow buttons 54a and 54b indicating the fine adjustment direction of the size or the position of model pattern 51 and one drag button 55 for dragging are combined. The shape of arrow buttons 54a and 54b may be any shape as long as the direction to be finely adjusted can be known. The shape of drag button 55 is not limited to a square as long as it can be distinguished from arrow buttons 54a and 54b, and may be any shape such as a circular.

In the second embodiment, there are four types of fine adjustment icons 52a to 52d, and first icon 52a for collectively scaling up or down both the size (length and width) of each lead 53 and the lead pitch of model pattern 51, second icon 52b for collectively scaling up or down only the length of each lead 53 of model pattern 51, third icon 52c for collectively scaling up or down only the width of each lead 53 of model pattern 51, and fourth icon 52d for collectively scaling up or down only the lead pitch of model pattern 51 are displayed on the screen of display device 15 in a predetermined positional relationship with model pattern 51.

Specifically, first icons 52a for collectively scaling up or down both the size of each lead 53 and the lead pitch of model pattern 51 are disposed at the four corners of model pattern 51, respectively. Each of first icons 52a includes two arrow buttons 54a and 54b facing outside and inside in the diagonal direction of model pattern 51, and drag button 55 located at the center of two arrow buttons 54a and 54b.

Each time the operator places the pointer of mouse 14 on arrow button 54a facing outside in the diagonal direction of model pattern 51 out of two arrow buttons 54a and 54b of first icon 52a and clicks the arrow button once, both the size (length and width) of each lead 53 and the lead pitch of model pattern 51 are collectively scaled up by a predetermined amount, and each time the operator places the pointer of mouse 14 on arrow button 54b facing inside in the diagonal direction of model pattern 51, which is the opposite direction, and clicks the arrow button once, both the size of each lead 53 and the lead pitch of model pattern 51 are collectively scaled down by a predetermined amount. Regarding the scaling-up/scaling-down of the size of model pattern 51, the size of model pattern 51 may be scaled up/down by fixing the corner of model pattern 51 on the side opposite to the clicking side, or the size of model pattern 51 may be scaled up/down by fixing the center of model pattern 51.

When the operator places the pointer of mouse 14 on drag button 55 of first icon 52a and performs dragging outwardly in the diagonal direction of model pattern 51, both the size of each lead 53 and the lead pitch of model pattern 51 are collectively scaled up according to the operation amount of the dragging, and when the operator performs dragging inwardly in the diagonal direction of model pattern 51, which is the opposite direction, both the size of each lead 53 and the lead pitch of model pattern 51 are collectively scaled down according to the operation amount of the dragging.

Second icons 52b for collectively scaling up or down only the length of each lead 53 of model pattern 51 are disposed at the tip end and the base end (root) of one lead 53 located at the center of model pattern 51, respectively. Each of second icons 52b includes two arrow buttons 54a and 54b facing outside and inside in the length direction of lead 53, and drag button 55 located at the center of two arrow buttons 54a and 54b. In the example of FIG. 7, second icons 52b are respectively disposed at the tip end and the base end of one lead 53 located at the center of model pattern 51, but the number and position of leads 53 at which second icons 52b are disposed may be changed as appropriate.

Each time the operator places the pointer of mouse 14 on arrow button 54a facing the outside of lead 53 out of two arrow buttons 54a and 54b of second icon 52b and clicks the arrow button once, only the length of each lead 53 of model pattern 51 is collectively scaled up by a predetermined amount, and each time the operator places the pointer of mouse 14 on arrow button 54b facing the inside of lead 53, which is the opposite direction, and clicks the arrow button once, only the length of each lead 53 of model pattern 51 is collectively scaled down by a predetermined amount.

When the operator places the pointer of mouse 14 on drag button 55 of second icon 52b and performs dragging toward the outside of lead 53, only the length of each lead 53 of model pattern 51 is collectively scaled up according to the operation amount of the dragging, and when the operator performs dragging toward the inside of lead 53, which is the opposite direction, only the length of each lead 53 of model pattern 51 is collectively scaled down according to the operation amount of the dragging.

Third icons 52c for collectively scaling up or down only the width of each lead 53 of model pattern 51 are disposed at the inner centers of two leads 53 located at the left and right ends of model pattern 51. Each of third icons 52c includes two arrow buttons 54a and 54b facing outside and inside in the width direction of lead 53, and drag button 55 located at the center of two arrow buttons 54a and 54b. The number and position of leads 53 on which third icons 52c are disposed may be changed as appropriate.

Each time the operator places the pointer of mouse 14 on arrow button 54a facing the outside of lead 53 out of two arrow buttons 54a and 54b of third icon 52c and clicks the arrow button once, only the width of each lead 53 of model pattern 51 is collectively scaled up by a predetermined amount, and each time the operator places the pointer of mouse 14 on arrow button 54b facing the inside of lead 53, which is the opposite direction, and clicks the arrow button once, only the width of each lead 53 of model pattern 51 is collectively scaled down by a predetermined amount.

When the operator places the pointer of mouse 14 on drag button 55 of third icon 52c and performs dragging toward the outside of lead 53, only the width of each lead 53 of model pattern 51 is collectively scaled up according to the operation amount of the dragging, and when the operator performs dragging toward the inside of lead 53, which is the opposite direction, only the width of each lead 53 of model pattern 51 is collectively scaled down according to the operation amount of the dragging.

Fourth icons 52d for collectively scaling up or down only the lead pitch of model pattern 51 are disposed at the outer centers of two leads 53 located at the left and right ends of model pattern 51. Each of fourth icons 52d includes two arrow buttons 54a and 54b facing the outside and the inside of model pattern 51, and drag button 55 located at the center of two arrow buttons 54a and 54b. The position and the number of fourth icons 52d may be changed as appropriate.

Each time the operator places the pointer of mouse 14 on arrow button 54a facing the outside of model pattern 51 out of two arrow buttons 54a and 54b of fourth icon 52d and clicks the arrow button once, only the lead pitch of model pattern 51 is collectively scaled up by a predetermined amount, and each time the operator places the pointer of mouse 14 on arrow button 54b facing the inside of model pattern 51, which is the opposite direction, and clicks the arrow button once, only the lead pitch of model pattern 51 is collectively scaled down by a predetermined amount.

When the operator places the pointer of mouse 14 on drag button 55 of fourth icon 52d and performs dragging toward the outside of model pattern 51, only the lead pitch of model pattern 51 is collectively scaled up according to the operation amount of the dragging, and when the operator performs dragging toward the inside of model pattern 51, which is the opposite direction, only the lead pitch of model pattern 51 is collectively scaled down according to the operation amount of the dragging.

In the second embodiment, the operator is able to change the amount of fine adjustment of first to fourth icons 52a to 52d per clicking by operating keyboard 13.

In addition to first to fourth icons 52a to 52d described above, an icon for finely adjusting the inclination angle of model pattern 51 in accordance with the inclination of component image 41 may be added or an icon for finely adjusting the position of model pattern 51 may be added. The fine adjustment of the position of model pattern 51 can also be performed by appropriately combining the clicking and the dragging of first to fourth icons 52a to 52d.

In the second embodiment described above, when the operator performs the fine adjustment operation of aligning lead 53 of model pattern 51 with lead 42 of component image 41 on the screen of display device 15, the size of lead 53 or the lead pitch of model pattern 51 is finely adjusted by a predetermined amount each time the operator places the pointer of mouse 14 on any of arrow buttons 54a and 54b of first to fourth icons 52a to 52d, which are fine adjustment icons, and clicks the arrow button once, so that the operator may just repeat the clicking while looking at the screen of display device 15 until the deviation between lead 53 of model pattern 51 and lead 42 of component image 41 is eliminated. Thus, even when the component shape data for image processing of the lead-attached component is created, the fine adjustment operation of model pattern 51 is simplified, and it is possible to efficiently create the component shape data for image processing of the lead-attached component using component image 41.

In the second embodiment, although lead 42 of component image 41 (lead 53 of model pattern 51) is arranged in the lateral direction (X-direction), when it is arranged in the longitudinal direction (Y-direction), the arrangement of first to fourth icons 52a to 52d may be rotated by 90° on the screen of display device 15.

Third Embodiment

Figure 8:
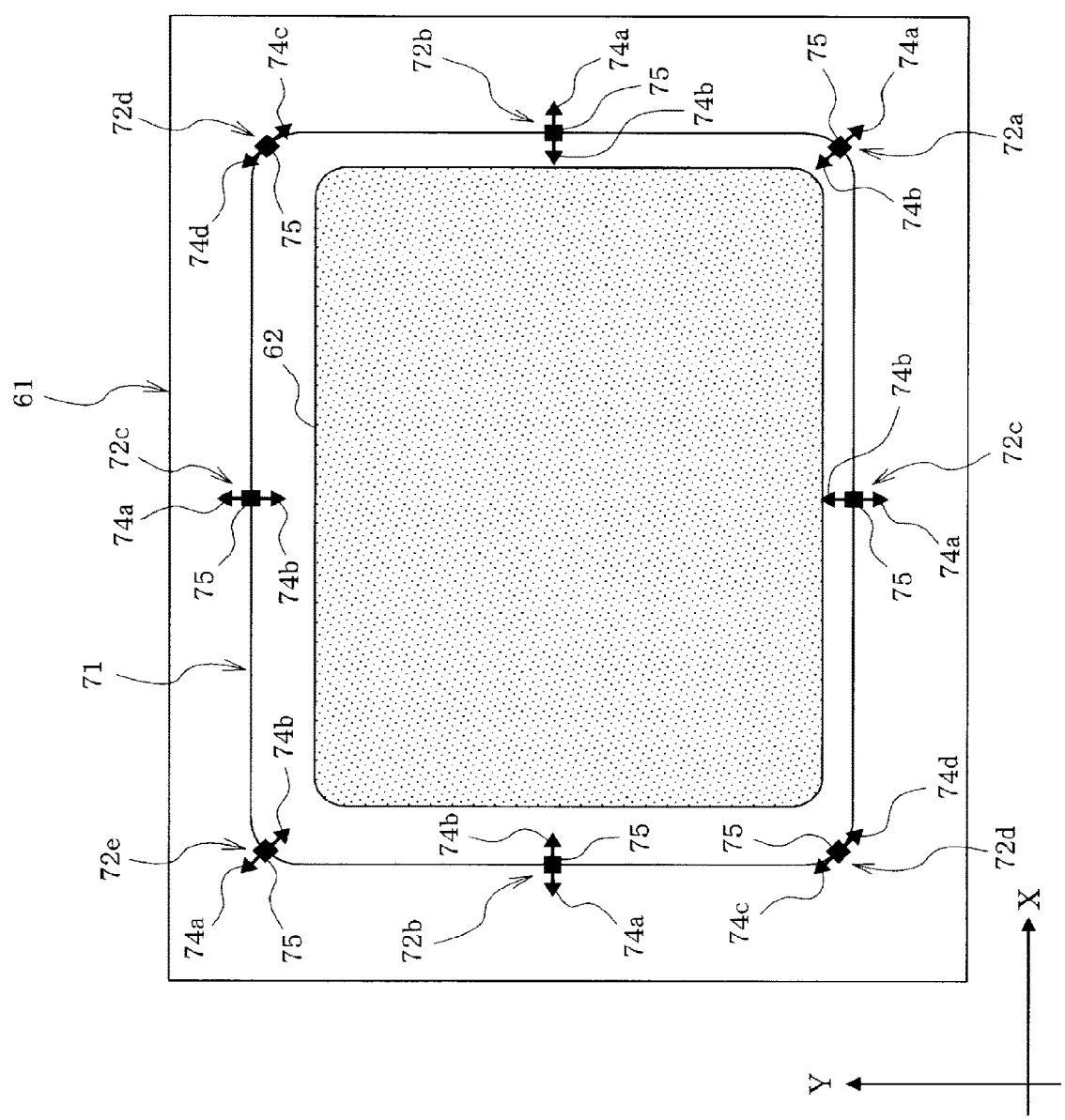
FIG. 8 is a diagram showing an example in which a model pattern according to a third embodiment is displayed on a component image in a superimposed manner.

Next, a third embodiment will be described with reference to FIG. 8. Here, descriptions of substantially the same parts as those of the first embodiment are omitted or simplified, and different portions are mainly described.

In the third embodiment, the measurement target portion of component image 61 is square component body shape 62. Component image 61 is captured by camera 12 of the component shape data creation system for image processing, but a component image captured by an external camera, such as a component imaging camera of the component mounting machine, may be acquired.

Model pattern 71 is created in advance by using CAD data, specification data, and the like of a body shape of the component for which the component shape data for image processing is to be created, and stored in storage device 16. Model pattern 71 may be created by computer 11 of the component shape data creation system for image processing, or may be created by an external system and acquired.

Fine adjustment icons 72a to 72e displayed on the screen of display device 15 in a predetermined positional relationship with model pattern 71 each have a shape in which arrow buttons 74a to 74d indicating the fine adjustment direction of the size or the position of model pattern 71 and one drag button 75 for dragging are combined. The shape of arrow buttons 74a to 74d may be any shape as long as the direction to be finely adjusted can be known. The shape of drag button 75 is not limited to a square as long as it can be distinguished from arrow buttons 74a to 74d, and may be any shape such as a circular.

In the third embodiment, there are five types of fine adjustment icons 72a to 72e, and first icon 72a for scaling up or down the size (lateral length and longitudinal length) of the component body shape of model pattern 71, second icon 72b for scaling up or down only the lateral length (X-direction length) of the component body shape of model pattern 71, third icon 72c for scaling up or down only the longitudinal length (Y-direction length) of the component body shape of model pattern 71, fourth icon 72d for finely adjusting the inclination angle of the component body shape of model pattern 71, and fifth icon 72e for collectively scaling up or down only the radius of curvature of the roundness of the four corners of the component body shape of model pattern 71 are displayed on the screen of display device 15 in a predetermined positional relationship with model pattern 71.

Specifically, first icon 72a for scaling up or down the size (lateral length and longitudinal length) of the component body shape of model pattern 71 is disposed at the lower right corner of model pattern 71, for example. First icon 72a includes two arrow buttons 74a and 74b facing outside and inside in the diagonal direction of model pattern 71, and drag button 75 located at the center of two arrow buttons 74a and 74b.

Each time the operator places the pointer of mouse 14 on arrow button 74a facing outside in the diagonal direction of model pattern 71 out of two arrow buttons 74a and 74b of first icon 72a and clicks the arrow button once, the size (lateral length and longitudinal length) of the component body shape of model pattern 71 is scaled up by a predetermined amount, and each time the operator places the pointer of mouse 14 on arrow button 74b facing inside in the diagonal direction of model pattern 71, which is the opposite direction, and clicks the arrow button once, the size of the component body shape of model pattern 71 is scaled down by a predetermined amount. Regarding the scaling-up/scaling-down of the size of model pattern 71, model pattern 71 may be scaled up/down by fixing the corner of model pattern 71 on the side opposite to the clicking side, or the size of model pattern 71 may be scaled up/down by fixing the center of model pattern 71.

When the operator places the pointer of mouse 14 on drag button 75 of first icon 72a and performs dragging outwardly in the diagonal direction of model pattern 71, the size of the component body shape of model pattern 71 is scaled up according to the operation amount of the dragging, and when the operator performs dragging inwardly in the diagonal direction of model pattern 71, which is the opposite direction, the size of the component body shape of model pattern 71 is scaled down according to the operation amount of the dragging.

Second icons 72*b* for scaling up or down only the lateral length of the component body shape of model pattern 71 are disposed at the center of the side portions on the lateral sides (left and right sides) of the component body shape of model pattern 71, respectively. Each of second icons 72*b* includes two arrow buttons 74*a* and 74*b* facing outside and inside in the lateral direction of model pattern 71, and drag button 75 located at the center of two arrow buttons 74*a* and 74*b*.

Each time the operator places the pointer of mouse 14 on arrow button 74*a* facing outside in the lateral direction of model pattern 71 out of two arrow buttons 74*a* and 74*b* of second icon 72*b* and clicks the arrow button once, only the lateral length of the component body shape of model pattern 71 is scaled up by a predetermined amount, and each time the operator places the pointer of mouse 14 on arrow button 74*b* facing inside in the lateral direction of model pattern 71, which is the opposite direction, and clicks the arrow button once, only the lateral length of the component body shape of model pattern 71 is scaled down by a predetermined amount.

When the operator places the pointer of mouse 14 on drag button 75 of second icon 72*b* and performs dragging outwardly in the lateral direction of model pattern 71, only the lateral length of the component body shape of model pattern 71 is scaled up according to the operation amount of the dragging, and when the operator performs dragging inwardly in the lateral direction of model pattern 71, which is the opposite direction, only the lateral length of the component body shape of model pattern 71 is scaled down according to the operation amount of the dragging.

Third icons 72*c* for scaling up or down only the longitudinal length of the component body shape of model pattern 71 are disposed at the center of the side portions on the longitudinal sides (upper and lower sides) of the component body shape of model pattern 71, respectively. Each of third icons 72*c* includes two arrow buttons 74*a* and 74*b* facing outside and inside in the longitudinal direction of model pattern 71, and drag button 75 located at the center of two arrow buttons 74*a* and 74*b*.

Each time the operator places the pointer of mouse 14 on arrow button 74*a* facing outside in the longitudinal direction of model pattern 71 out of two arrow buttons 74*a* and 74*b* of third icon 72*c* and clicks the arrow button once, only the longitudinal length of the component body shape of model pattern 71 is scaled up by a predetermined amount, and each time the operator places the pointer of mouse 14 on arrow button 74*b* facing inside in the longitudinal direction of model pattern 71, which is the opposite direction, and clicks the arrow button once, only the longitudinal length of the component body shape of model pattern 71 is scaled down by a predetermined amount.

When the operator places the pointer of mouse 14 on drag button 75 of third icon 72*c* and performs dragging outwardly in the longitudinal direction of model pattern 71, only the longitudinal length of the component body shape of model pattern 71 is scaled up according to the operation amount of the dragging, and when the operator performs dragging inwardly in the longitudinal direction of model pattern 71, which is the opposite direction, only the longitudinal length of the component body shape of model pattern 71 is scaled down according to the operation amount of the dragging.

Fourth icons 72*d* for finely adjusting the inclination angle of the component body shape of model pattern 71 are disposed at the two corners in the diagonal direction of model pattern 71, respectively. Each of fourth icons 72*d* includes two arrow buttons 74*c* and 74*d* facing in the clockwise direction and the counterclockwise direction of model pattern 71, and drag button 75 located at the center of two arrow buttons 74*c* and 74*d*.

Each time the operator places the pointer of mouse 14 on arrow button 74*c* facing in the clockwise direction of model pattern 71 out of two arrow buttons 74*c* and 74*d* of fourth icon 72*d* and clicks the arrow button once, the component body shape of model pattern 71 is rotated clockwise by a predetermined angle, and each time the operator places the pointer of mouse 14 on arrow button 74*d* facing in the counterclockwise direction of model pattern 71, which is the opposite direction, and clicks the arrow button once, the component body shape of model pattern 71 is rotated counterclockwise by a predetermined angle. Regarding the rotation of the component body shape of model pattern 71, the component body shape of model pattern 71 may be rotated by fixing the corner of model pattern 71 on the side opposite to the clicking side, or may be rotated by fixing the center of model pattern 71.

When the operator places the pointer of mouse 14 on drag button 75 of fourth icon 72*d* and performs dragging in the clockwise direction of model pattern 71, the component body shape of model pattern 71 is rotated clockwise according to the operation amount of the dragging, and when the operator performs dragging in the counterclockwise direction of model pattern 71, which is the opposite direction, the component body shape of model pattern 71 is rotated counterclockwise according to the operation amount of the dragging.

Fifth icon 72*e* for collectively scaling up or down only the radius of curvature of the roundness of the four corners of the component body shape of model pattern 71 is disposed at the upper left corner of model pattern 71, for example. Fifth icon 72*e* includes two arrow buttons 74*a* and 74*b* facing outside and inside in the diagonal direction of model pattern 71, and drag button 75 located at the center of two arrow buttons 74*a* and 74*b*.

Each time the operator places the pointer of mouse 14 on arrow button 74*a* facing outside in the diagonal direction of model pattern 71 out of two arrow buttons 74*a* and 74*b* of fifth icon 72*e* and clicks the arrow button once, only the radius of curvature of the roundness of the four corners of the component body shape of model pattern 71 is collectively scaled down by a predetermined amount, and each time the operator places the pointer of mouse 14 on arrow button 74*b* facing inside in the diagonal direction of model pattern 71, which is the opposite direction, and clicks the arrow button once, only the radius of curvature of the roundness of the four corners of the component body shape of model pattern 71 is collectively scaled up by a predetermined amount.

When the operator places the pointer of mouse 14 on drag button 75 of fifth icon 72*e* and performs dragging outwardly in the diagonal direction of model pattern 71, only the radius of curvature of the roundness of the four corners of the component body shape of model pattern 71 is collectively scaled down according to the operation amount of the dragging, and when the operator performs dragging inwardly in the diagonal direction of model pattern 71, which is the opposite direction, only the radius of curvature of the roundness of the four corners of the component body shape of model pattern 71 is collectively scaled up according to the operation amount of the dragging.

In the third embodiment, the operator is able to change the amount of fine adjustment of first to fifth icons 72*a* to 72*e* per clicking by operating keyboard 13.

The position and the number of first to fifth icons 72*a* to 72*e* may be changed as appropriate.

In addition, an icon for finely adjusting the position of model pattern 71 may be added. The fine adjustment of the position of model pattern 71 can also be performed by appropriately combining the clicking and the dragging of first to fourth icons 72a to 72d.

In the third embodiment described above, when the operator performs the fine adjustment operation of aligning the component body shape of model pattern 71 with component body shape 62 of component image 61 on the screen of display device 15, the size, the position, and the radius of curvature of the roundness of the corner of model pattern 71 are finely adjusted by a predetermined amount each time the operator places the pointer of mouse 14 on any of arrow buttons 74a to 74d of first to fifth icons 72a to 72e, which are fine adjustment icons, and clicks the arrow button once, so that the operator may just repeat the clicking while looking at the screen of display device 15 until the deviation between the component body shape of model pattern 71 and the component body shape of component image 61 is eliminated. Thus, even when the component shape data for image processing including the data of the component body shape is created, the fine adjustment operation of model pattern 71 is simplified, and it is possible to efficiently create the component shape data for image processing using component image 61.

The component shape data creation system for image processing of the present disclosure is not limited to the configuration provided outside the component mounting machine, and may be installed on the component mounting machine. In this case, at the time of investigating the cause of the error occurred in the component mounting machine, the component picked up by a suction nozzle of the component mounting machine is captured by the component recognition camera of the component mounting machine, and the component image may be displayed on the display device of the component mounting machine to recreate the component shape data for image processing. As described above, when the cause of the error occurred in the component mounting machine is the mismatch of the component shape data for image processing, it is possible to correct the mismatched data to component shape data for image processing adapted to the image processing system of the component mounting machine, and it is possible to reduce the occurrence frequency of the error in the component mounting machine and to improve the image recognition accuracy of the component.

In addition, the present disclosure is not limited to the above first to third embodiments, and it is needless to say that the present disclosure can be implemented by changing the number of types of fine adjustment icons, by changing the color for each type of fine adjustment icons to make the type of fine adjustment icons easy to distinguish visually, or by displaying a phrase for describing the function for each type of fine adjustment icons on the screen of the display device to make the function for each type of fine adjustment icons easy to understand, or by various changes within a range not deviating from the gist.

REFERENCE SIGNS LIST

11 . . . computer (model pattern display section, icon display section, model pattern fine adjustment section, component shape data creation section); 12 . . . camera; 13 . . . keyboard; 14 . . . mouse; 15 . . . display device; 21 . . . component image; 22 . . . bump; 31 . . . model pattern; 32a to 32d . . . first to fourth icons (fine adjustment icons); 33 . . . bump; 34a to 34c . . . arrow buttons; 35 . . . drag button; 41 . . . component image; 42 . . . lead; 51 . . . model pattern; 52a to 52d . . . first to fourth icons (fine adjustment icons); 53 . . . lead; 54a, 54b . . . arrow buttons; 55 . . . drag button; 61 . . . component image; 62 . . . component body shape; 71 . . . model pattern; 72a to 72e . . . first to fifth icons (fine adjustment icons); 74a to 74d . . . arrow buttons; 75 . . . drag button

The invention claimed is:

1. A component shape data creation system for image processing for creating component shape data for image processing used when performing image recognition of a component to be mounted using a component mounting machine, the system comprising:
    a display device configured to display a component image obtained by imaging a component for which the component shape data for image processing is to be created;
    a model pattern display section configured to display, on the component image, a model pattern corresponding to a measurement target portion of the component image displayed on a screen of the display device, in a superimposed manner;
    an icon display section configured to display, on the screen of the display device, a fine adjustment icon for finely adjusting at least one of a size and a position of the model pattern superimposed on the component image on the screen of the display device in a predetermined positional relationship with the model pattern, the fine adjustment icon being displayed on the model pattern;
    a model pattern fine adjustment section configured to, when an operator performs a fine adjustment operation of aligning the model pattern with the measurement target portion of the component image on the screen of the display device, finely adjust at least one of the size and the position of the model pattern by a predetermined amount each time the operator places a pointer of a mouse on the fine adjustment icon displayed on the model pattern and clicks the fine adjustment icon once; and
    a component shape data creation section configured to acquire information on at least one of the size and the position of the model pattern finely adjusted by the model pattern fine adjustment section according to the number of clicks until the fine adjustment operation is completed and create the component shape data for image processing.

2. The component shape data creation system for image processing according to claim 1, wherein the measurement target portion of the component image is any of an arrangement pattern of bumps on a lower surface of the component, an arrangement pattern of leads protruding from a side surface of the component, and a component body shape.

3. The component shape data creation system for image processing according to claim 1,
    wherein the icon display section displays the fine adjustment icon by adding an arrow button indicating a fine adjustment direction of the size or the position of the model pattern thereto, and
    the model pattern fine adjustment section finely adjusts the size or the position of the model pattern by a predetermined amount in an arrow direction of the arrow button each time the operator places the pointer of the mouse on the arrow button and clicks the arrow button once.

4. The component shape data creation system for image processing according to claim 1, wherein the icon display section displays a fine adjustment icon to be disposed on a side portion or a corner of the model pattern by adding an arrow button facing an outside of the model pattern and an arrow button facing an inside of the model pattern thereto, and the model pattern fine adjustment section scales up the size of the model pattern by a predetermined amount each time the operator places the pointer of the mouse on the arrow button facing the outside of the model pattern and clicks the arrow button once, and scales down the size of the model pattern by a predetermined amount each time the operator places the pointer of the mouse on the arrow button facing the inside of the model pattern and clicks the arrow button once.

5. The component shape data creation system for image processing according to claim 1, wherein the icon display section displays the fine adjustment icon by adding a drag button for dragging thereto, and when the operator places the pointer of the mouse on the drag button and performs dragging, the model pattern fine adjustment section scales up or down the size of the model pattern according to a direction and an operation amount of the dragging, or moves the position of the model pattern by the operation amount in a direction of the dragging.

6. The component shape data creation system for image processing according to claim 1, wherein, when the measurement target portion of the component image is an arrangement pattern of bumps on a lower surface of the component, the icon display section displays, on the screen of the display device in a predetermined positional relationship with the model pattern, a first fine adjustment icon for collectively scaling up or down both a size of each bump and a bump pitch of the model pattern, a second fine adjustment icon for collectively scaling up or down only the size of each bump of the model pattern, and a third fine adjustment icon for collectively scaling up or down only the bump pitch of the model pattern, and the model pattern fine adjustment section collectively scales up or down both the size of each bump and the bump pitch of the model pattern by a predetermined amount each time the operator places the pointer of the mouse on the first fine adjustment icon and clicks the first fine adjustment icon once, collectively scales up or down only the size of each bump of the model pattern by a predetermined amount each time the operator places the pointer of the mouse on the second fine adjustment icon and clicks the second fine adjustment icon once, and scales up or down only the bump pitch of the model pattern by a predetermined amount each time the operator places the pointer of the mouse on the third fine adjustment icon and clicks the third fine adjustment icon once.

7. The component shape data creation system for image processing according to claim 1, wherein, when the measurement target portion of the component image is an arrangement pattern of leads protruding from a side surface of the component, the icon display section displays, on the screen of the display device in a predetermined positional relationship with the model pattern, a first fine adjustment icon for collectively scaling up or down both a size of each lead and a lead pitch of the model pattern, a second fine adjustment icon for collectively scaling up or down only a length of each lead of the model pattern, a third fine adjustment icon for collectively scaling up or down only a width of each lead of the model pattern, and a fourth fine adjustment icon for collectively scaling up or down only the lead pitch of the model pattern, and the model pattern fine adjustment section collectively scales up or down both the size of each lead and the lead pitch of the model pattern by a predetermined amount each time the operator places the pointer of the mouse on the first fine adjustment icon and clicks the first fine adjustment icon once, scales up or down only the length of each lead of the model pattern by a predetermined amount each time the operator places the pointer of the mouse on the second fine adjustment icon and clicks the second fine adjustment icon once, collectively scales up or down only the width of each lead of the model pattern by a predetermined amount each time the operator places the pointer of the mouse on the third fine adjustment icon and clicks the third fine adjustment icon once, and collectively scales up or down only the lead pitch of the model pattern by a predetermined amount each time the operator places the pointer of the mouse on the fourth fine adjustment icon and clicks the fourth fine adjustment icon once.

8. The component shape data creation system for image processing according to claim 1, wherein, when the measurement target portion of the component image is a component body shape, the icon display section displays, on the screen of the display device in a predetermined positional relationship with the model pattern, a first fine adjustment icon for scaling up or down a size of the component body shape of the model pattern, a second fine adjustment icon for scaling up or down only a lateral length of the component body shape of the model pattern, and a third fine adjustment icon for scaling up or down only a longitudinal length of the component body shape of the model pattern, and the model pattern fine adjustment section scales up or down the size of the component body shape of the model pattern by a predetermined amount each time the operator places the pointer of the mouse on the first fine adjustment icon and clicks the first fine adjustment icon once, scales up or down only the lateral length of the component body shape of the model pattern by a predetermined amount each time the operator places the pointer of the mouse on the second fine adjustment icon and clicks the second fine adjustment icon once, and scales up or down only the longitudinal length of the component body shape of the model pattern by a predetermined amount each time the operator places the pointer of the mouse on the third fine adjustment icon and clicks the third fine adjustment icon once.

9. The component shape data creation system for image processing according to claim 8, wherein, when the measurement target portion of the component image is the component body shape, the icon display section displays, on the screen of the display device in a predetermined positional relationship with the model pattern, a fourth fine adjustment icon for finely adjusting only an inclination angle of the component body shape of the model pattern, and a fifth fine adjustment icon for scaling up or down only a radius of curvature of roundness of a corner of the component body shape of the model pattern in addition to the first to third fine adjustment icons, and the model pattern fine adjustment section rotates the component body shape of the model pattern by a predetermined angle each time the operator places the pointer of the mouse on the fourth fine adjustment icon and clicks the fourth fine adjustment icon once, and scales up or down only the radius of curvature of roundness of the corner of the component body shape of the model pattern by a predetermined amount each time the operator places the pointer of the mouse on the fifth fine adjustment icon and clicks the fifth fine adjustment icon once.

10. The component shape data creation system for image processing according to claim 1, wherein the operator is able to change an amount of fine adjustment per clicking of the model pattern fine adjustment section.

11. A component shape data creation method for image processing for creating component shape data for image processing used when performing image recognition of a component to be mounted using a component mounting machine, the method comprising:

acquiring a component image obtained by imaging a component for which the component shape data for image processing is to be created and displaying the component image on a screen of a display device;

displaying, on the component image, a model pattern corresponding to a measurement target portion of the component image displayed on a screen of the display device in a superimposed manner;

displaying, on the screen of the display device, a fine adjustment icon for finely adjusting at least one of a size and a position of the model pattern superimposed on the component image on the screen of the display device in a predetermined positional relationship with the model pattern, the fine adjustment icon being displayed on the model pattern;

when an operator performs a fine adjustment operation of aligning the model pattern with the measurement target portion of the component image on the screen of the display device, finely adjusting at least one of the size and the position of the model pattern by a predetermined amount each time the operator places a pointer of a mouse on the fine adjustment icon displayed on the model pattern and clicks the fine adjustment icon once; and acquiring information on at least one of the size and the position of the model pattern finely adjusted according to the number of clicks until the fine adjustment operation is completed and creating the component shape data for image processing.

* * * * *